United States Patent
Xian et al.

(10) Patent No.: US 11,393,379 B2
(45) Date of Patent: Jul. 19, 2022

(54) DRIVING UNIT, GATE DRIVING CIRCUIT, ARRAY SUBSTRATE, AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Jianbo Xian, Beijing (CN); Chunping Long, Beijing (CN); Hui Li, Beijing (CN); Yong Qiao, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/481,376

(22) Filed: Sep. 22, 2021

(65) Prior Publication Data
US 2022/0005395 A1 Jan. 6, 2022

Related U.S. Application Data

(63) Continuation of application No. 16/769,692, filed as application No. PCT/CN2019/123922 on Dec. 9, 2019, now Pat. No. 11,170,684.

(30) Foreign Application Priority Data

Jan. 23, 2019 (CN) .................... 201920114373.X

(51) Int. Cl.
*G09G 3/20* (2006.01)
(52) U.S. Cl.
CPC ....... *G09G 3/20* (2013.01); *G09G 2300/0809* (2013.01); *G09G 2310/0286* (2013.01)

(58) Field of Classification Search
CPC ......... G09G 3/3266; G09G 2300/0804; G09G 2300/0809; G09G 2310/0281; G09G 2310/0286
See application file for complete search history.

(56) References Cited

U.S. PATENT DOCUMENTS 6,462,723 B1 10/2002 Yamazaki et al.
10,019,959 B2 * 7/2018 Wang ..................... G11C 19/28
(Continued)

FOREIGN PATENT DOCUMENTS

CN 101499474 A 8/2009
CN 103928458 A 7/2014
(Continued)

OTHER PUBLICATIONS

International Search Report dated Mar. 6, 2020, issued in counterpart Application No. PCT/CN2019/123922. (12 pages).
(Continued)

*Primary Examiner* — Gerald Johnson
(74) *Attorney, Agent, or Firm* — WHDA, LLP

(57) ABSTRACT

The present disclosure relates to a driving unit. The driving unit may include a first driving sub-circuit, a second driving sub-circuit, and a driving control circuit. The first driving sub-circuit may include a plurality of first switching elements, and at least some of the plurality of first switching elements may be configured to output a first signal to a first output terminal of the driving unit in response to a control signal from the driving control circuit. The second driving sub-circuit may include one or more second switching elements, and at least one of the one or more second switching elements may be configured to output a second signal to a second output terminal of the driving unit in response to the control signal from the driving control
(Continued)

circuit. The driving control circuit may be configured to output the control signal at a control signal output terminal.

19 Claims, 9 Drawing Sheets

(56) References Cited

U.S. PATENT DOCUMENTS

| | | |
|---|---|---|
| 2011/0254104 A1 | 10/2011 | Maeda |
| 2014/0197463 A1 | 7/2014 | Gan et al. |
| 2015/0102421 A1 | 4/2015 | Morimoto et al. |
| 2015/0255018 A1 | 9/2015 | Aoki et al. |
| 2018/0190204 A1 | 7/2018 | Shin et al. |
| 2019/0004643 A1* | 1/2019 | Ma ........................... G09G 3/20 |
| 2019/0164497 A1* | 5/2019 | Wang ...................... G11C 19/28 |
| 2019/0206297 A1* | 7/2019 | Dong ........................ G09G 3/20 |
| 2019/0259335 A1* | 8/2019 | Yang ..................... G09G 3/3266 |

FOREIGN PATENT DOCUMENTS

| | | |
|---|---|---|
| CN | 107275327 A | 10/2017 |
| CN | 108281116 A | 7/2018 |
| CN | 209401289 U | 9/2019 |
| JP | 2000022155 A | 1/2000 |

OTHER PUBLICATIONS

Non-Final Office Action dated May 27, 2021, issued in U.S. Appl. No. 16/769,692 (17 pages).
Notice of Allowance dated Jul. 13, 2021, issued in U.S. Appl. No. 16/769,692 (5 pages).

* cited by examiner

DRIVING UNIT, GATE DRIVING CIRCUIT, ARRAY SUBSTRATE, AND DISPLAY APPARATUS

CROSS-REFERENCE TO RELATED APPLICATIONS

This is a continuation of U.S. application Ser. No. 16/769,692, filed on Jun. 4, 2020, which claims benefit of the filing date of Chinese Patent Application No. 201920114373.X filed on Jan. 23, 2019, the disclosure of which is hereby incorporated in its entirety by reference.

TECHNICAL FIELD

The disclosure relates to the field of display technology, in particular, to a driving unit, a gate driving circuit, an array substrate, and a display apparatus.

BACKGROUND

When a display device performs gate line scanning row by row, a scan signal is output to each row of gate line to control turn-on and turn-off of each row of gate line to load the data signal. Whether the turn-on and turn-off timings of the gate line are accurate will directly affect the display quality of the display device.

BRIEF SUMMARY

An embodiment of the present disclosure provides a driving unit. The driving unit may include a first driving sub-circuit, a second driving sub-circuit, and a driving control circuit. The first driving sub-circuit may include a plurality of first switching elements, and at least some of the plurality of first switching elements may be configured to output a first signal to a first output terminal of the driving unit in response to a control signal from the driving control circuit. The second driving sub-circuit may include one or more second switching elements, and at least one of the one or more second switching elements may be configured to output a second signal to a second output terminal of the driving unit in response to the control signal from the driving control circuit. The driving control circuit may be configured to output the control signal at a control signal output terminal to control states of the plurality of first switching elements and the one or more second switching elements. The number of the first switching elements may be at least one more than the number of the second switching elements.

Optionally, a first control signal input terminal of each of the first switching elements may be coupled to the control signal output terminal of the driving control circuit, and a first signal input terminal of each of the first switching elements may be coupled to a first signal generating terminal, a first signal output terminal of each of the first switching elements may be connected to the first output terminal of the driving unit. A second control signal input terminal of each of the one or more second switching elements may be coupled to the control signal output terminal of the driving control circuit, and a second signal input terminal of each of the one or more second switching elements may be coupled to a second signal generating terminal, a second signal output terminal of each of the one or more second switching elements ray be coupled to the second output terminal of the driving unit.

Optionally, the first output terminal and the second output terminal may be a same output terminal or spaced apart from each other.

Optionally, the control signal may include a first control signal and a second control signal. The first control signal may be configured to turn on the first switching elements and turn off the second switching elements. The second control signal may be configured to turn on the second switching elements and turn off the first switching elements.

Optionally, each of the first switching elements and the second switching elements may include a transistor.

Optionally, the first driving sub-circuit further may include a diode. one electrode of the diode may be coupled to the first signal generating terminal, and the other electrode of the diode may be coupled to the first output terminal; and/or the second driving sub-circuit may further include a diode. One electrode of the diode may be coupled to the second signal generating terminal, and the other electrode is connected to the second output terminal.

Optionally, each of the first switching elements may be one of a P-type thin film transistor or an N-type thin film transistor, and each of the second switching elements may be the other one of the P-type thin film transistor or the N-type thin film transistor.

Optionally, the first switching elements may be P-type thin film transistors, the second switching elements may be thin film transistors; and the number of the P-type thin film transistors may be at least two more than the number of the N-type thin film transistors.

Optionally, an active region of the thin film transistor may include a source region and a drain region contacting the source and the drain respectively and a semiconductor region between the source region and the drain region, a width to length ratio of the active region of the P-type thin film transistor may be 1.2 to 4 times a width to length ratio of the active region of the N-type thin film transistor; and/or, a length of the active region of the N-type thin film transistor may be greater than a length of the active region of the P-type thin film transistor; and/or, a width of the active region of the N-type thin film transistor may be smaller than a width of the active region of the P-type thin film transistor; and/or, an overlapping area of a gate and the active region of the P-type thin film transistor may be larger than an overlapping area of a gate and the active region of the N-type thin film transistor.

Optionally, a source and a drain of the transistor may be in the same layer, and at least one conductive block may be disposed between the source and the drain, the conductive block may be in the same layer as the source and the drain, and the conductive block, the source, and the drain may be spaced apart from one another.

Optionally, active regions of at least some of the first switching elements of the first driving sub-circuit may be spaced apart from one another, and/or active regions of at least some of the second switching elements of the second driving sub-circuit may be spaced apart from one another.

Optionally, control signal input terminals of the first switching elements and control signal input terminals of the second switching elements may be coupled to the control signal output terminal through a control signal input line; and/or first signal input terminals of the first switching elements may be coupled to the first signal generating terminal through a first signal input line; and/or, second signal input terminals of the second switching elements may be coupled to the second signal generating terminal through a second signal input line; and/or first signal output terminals of the first switching elements and second signal output terminals of the second switching elements may be coupled to a driving signal output line.

Optionally, the driving signal output line and the control signal input line may be in different layers and overlap each other; the driving signal output line and at least one of the first signal input line and the second signal input line may be in different layers and overlap each other; an overlapping area of the driving signal output line and the control signal input line may be greater than an overlapping area of the driving signal output line and the first signal input line; and/or, an overlapping area of the driving signal output line and the control signal input line may be greater than an overlapping area of the driving signal output line and the second signal input line.

Optionally, the first signal input line and the driving signal output line may be at different layers and perpendicular to each other; and/or, the second signal input line and the driving signal output line may be at different layers and perpendicular to each other.

Optionally, at least two of the first signal input line, the second signal input line, the control signal input line, and the driving signal output line may be parallel to each other or one another.

Optionally, the control signal input line may be of a ring structure; and/or, the first switching elements of the first driving sub-circuit may be distributed on both sides of the driving signal output line; and/or the second switching elements of the second driving sub-circuit may be distributed on both sides of the driving signal output line; and/or, the first switching elements and the second switching elements may be located between the first signal input line and the second signal input line.

Optionally, the second driving sub-circuit may include at least two second switching elements, and the driving control circuit is a shift register.

Another embodiment of the present disclosure provides a gate driving circuit. The gate driving circuit may include a plurality of driving units comprising the driving unit. The first output terminal and the second output terminal of the driving unit may be connected to at least one gate line.

Another embodiment of the present disclosure provides an array substrate. The array substrate may include the gate driving circuit.

Another embodiment of the present disclosure provides a display apparatus.

The display apparatus may include the array substrate.

BRIEF DESCRIPTION OF THE DRAWINGS

The drawings are used to provide a further understanding of the technical solutions of the present disclosure, and constitute a part of the specification, which together with the embodiments of the present application are used to explain the technical solutions of the present disclosure, and do not constitute a limitation of the technical solutions of the present disclosure. The shapes and sizes of the various components in the drawings do not reflect true proportions, and are merely intended to illustrate the present disclosure.

DETAILED DESCRIPTION

Figure 1:
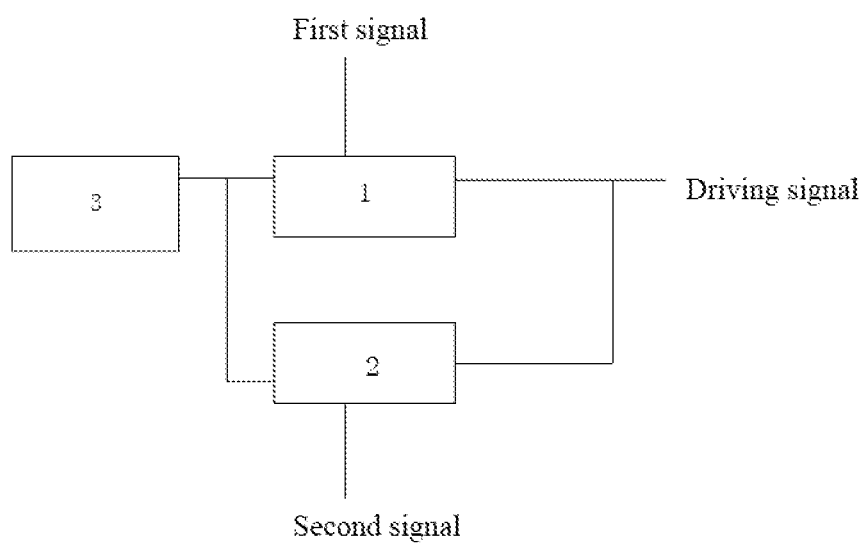
FIG. 1 is a structural block diagram of a driving unit according to one embodiment of the present invention.

The specific embodiments of the present disclosure are further described in detail below with reference to the drawings and embodiments. The following examples are intended to illustrate the disclosure but are not intended to limit the scope of the disclosure. It should be noted that, in the case of no conflict, the features in the embodiments and the embodiments in the present application could be arbitrarily combined with each other. Throughout the description of the disclosure, reference is made to FIGS. 1-9. When referring to the figures, like structures and elements shown throughout are indicated with like reference numerals. It should be understood that the dimensions of the various parts shown in the drawings are not drawn in the actual scale.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covers", "on", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

In addition, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

Unless otherwise defined, all the terms (including the technical and scientific terms) used herein have the same meanings as commonly understood by one of ordinary skill in the art to which the present disclosure is directed. It is also understood that the teens such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

A numerical range modified by "about" herein means that the upper and lower limits of the numerical range can vary by 10% thereof.

In the related art, it is common to output a scan signal to a gate line through a gate driving circuit (Gate Driver on Array, GOA for short). The gate driving circuit may include a plurality of cascaded shift registers. Each shift register may be coupled with one gate line, and the scan signal of the gate line is sequentially transferred from the previous stage of shift register to the next stage shift register. The scan signal is input to the gate line connected thereto through each shift register, thereby implementing row by row scan of the gate line.

However, in the above gate driving circuit, the timing at which the next stage shift register outputs the scan signal to the gate line is completely dependent on the shift register of the previous stage, and therefore, it is difficult to accurately control the turn-on and turn-off timing of the gate line. Furthermore, it is not possible to flexibly change the turn-on and turn-off timings of the gate lines. In addition, the cascade relationship of the gate drive circuit is complicated. Once a transistor is damaged, the entire gate driving circuit is affected, thereby affecting the turn-on and turn-off timings of the gate lines.

As shown in FIG. 1 to FIG. 9, the embodiments of the present disclosure provide a driving unit.

In one embodiment, referring to FIG. 1, the driving unit includes a first driving sub-circuit 1, a second driving sub-circuit 2, and a driving control circuit 3.

The first driving sub-circuit 1 includes a plurality of first switching elements 11. The first control signal input terminal 101 of each of the first switching elements 11 is connected to the control signal output terminal 301 of the driving control circuit 3. The first signal input terminal 102 of each of the first switching elements 11 is connected to the first signal generating terminal. The first sisal output terminal 103 of each of the first switching elements 11 is connected to the first output terminal of the driving unit.

The second driving sub-circuit 2 includes at least one second switching element 21. The second control signal input terminal 201 of each second switching element 21 is connected to the control signal output terminal 301 of the driving control circuit 3. The second signal input terminal 202 of each second switching element 21 is connected to the second signal generating terminal. The second signal output terminal 203 of each second switching element 21 is connected to the second output terminal of the driving unit.

The driving control circuit 3 is configured to output a control signal at the control signal output terminal 301 to control the states of the first switching elements 11 and the second switching elements 21.

Therein, the number of the first switching elements 11 is at least one more than the number of the second switching elements 21.

In the present embodiment, that "the driving control circuit 3 is used to output the control signal at the control signal output terminal 301" means that the specific circuit structure (for example, a shift register circuit) of the driving control circuit 3 should be designed so that under proper driving, its circuit structure has the ability to generate specific control signals, so it is a description of the product structure.

In the present embodiment, the driving control circuit 3 outputs a control signal for controlling the states (on or off) of the first switching elements 11 and the second switching elements 21. When the first switching element 11 is turned on, the first output terminal can output the first signal. When the second switching element 21 is turned on, the second output terminal can output the second signal. The first switching element 11 and the second switching element 21 can be turned on simultaneously or separately, that is, the first signal and the second signal can be simultaneously output or alternatively output.

Therefore, the first signal output terminals 103 (the first output terminal) of all the first switching elements 11 can be connected to a first signal receiving terminal (for example, a gate line 8, which can be a gate line 8 of a pixel region of a display apparatus). The second signal output terminals 203 (the second output terminal) of all the second switching elements 21 can be connected to a second signal receiving terminal for example, another gate line 8). Therefore, if the first output terminal and the second output terminal are two output terminals arranged at an interval, the driving unit can simultaneously output at least two driving signals (the first signal and the second signal) to at least two receiving terminals (for example, one first gate line and one second gate line) respectively.

Optionally, the first output terminal and the second output terminal may be the same output terminal. That is to say, the output terminal is only used to output a driving signal (the first signal or the second signal) to a receiving terminal, so that the fast signal and the second signal may be time-divisionally output.

In this embodiment, the number of the first switching elements 11 is at least one more than the number of the second switching elements 21. Some of the first switching elements 11 can serve as standby switching elements. Thus, when a first switching element 11 is damaged, this does not affect the output of the first signal. At the same time, compared to only one first switching element 11, the plurality of first switching elements 11 can simultaneously output a driving signal, thereby improving the efficiency of the first driving sub-circuit 1 outputting the first signal.

Of course, optionally, the second driving sub-circuit 2 comprises at least two second switching elements. In other words, the second driving sub-circuit 2 is also provided with some standby second switching elements 21. Of course, at this time, the first driving sub-circuit 1 is provided with at least three first switching elements 11.

Optionally, the control signal outputted by the control signal output terminal 301 includes a first control signal and a second control signal. The first control signal is used for turning on the first switching elements 11 and turning off the second switching elements 21. The second control signal is for turning on the second switching elements 21 and turning off the first switching elements 11.

That is to say, the states of the first switching element 11 and the second switching element 21 are always opposite. That is, one is always turned on and the other is turned off, so that the driving unit can only output one driving signal (first signal or second signal) to one receiving terminal at a time. Of course, the first control signal and the second control signal may also be the same signal.

Optionally, the receiving terminal may be a gate line 8 of a pixel area of the display apparatus. The first driving sub-circuit 1 and the second driving sub-circuit 2 may be connected to the same gate line 8. In one embodiment, the drive control circuit 3 (for example, one stage of shift register in the GOA circuit) simultaneously outputs the first control signal to the first driving sub-circuit 1 and the second driving sub-circuit 2. The gate line 8 can receive the first signal, and accordingly the reception of the second signal by the gate line 8 is blocked. In one embodiment, the driving control circuit 3 simultaneously outputs a second control signal to the first driving sub-circuit 1 and the second driving sub-circuit 2. The gate line 8 can receive the second signal, and accordingly the reception of the first signal by the gate line 8 is blocked. The gate line 8 determines the turn-on timing and turn-off timing of the gate line 8 according to the timing of the received first signal and the second signal.

In one embodiment, the first signal and the second signal are fixed reference voltages. Specifically, the reference voltage values of the first signal and the second signal may be different. For example, a first signal (e.g., a fixed high voltage signal) is used to turn on the gate hue 8, and a second signal (e.g., a fixed low voltage signal) is used to turn off the gate line 8. The timing at which the gate line 8 receives the first signal is the turn-on timing of the gate line 8. Similarly, the timing at which the gate line 8 receives the second signal is the turn-off timing of the gate line 8. In another embodiment, the first signal and the second signal may also be a pair of clock signals (the two clock signals may partially overlap or not overlap). For example, the gate line 8 receives a high level signal to be turned on and a low level signal to be turned off. The turn-on timing of the gate line 8 is when the high level signals of the first signal and the second signal are received. Similarly, the turn-off timing of the gate line 8 is when it receives the low level signals of the first signal and the second signal. In another embodiment, in order to facilitate control of the output time and phase, the first signal and the second signal may also be signals whose voltage polarities or phases are consistently opposite.

It can be seen that during the scanning process of the gate line 8, the turn-on timing and the turn-off timing of the gate line 8 are the result of the coordination of both the control signals (the first control signal and the second control signal and the input signals (the first signal, the second signal). Therefore, compared with the gate driving circuit in the prior art where the timing of outputting the scanning signal to the gate line 8 is completely dependent on the timing of the output signal of the previous stage of shift register, the present embodiment can flexibly control the turning-on timing and tuning-off timing of gate line 8 by controlling the above two groups of signals or any of the two groups of signals.

Figure 2:
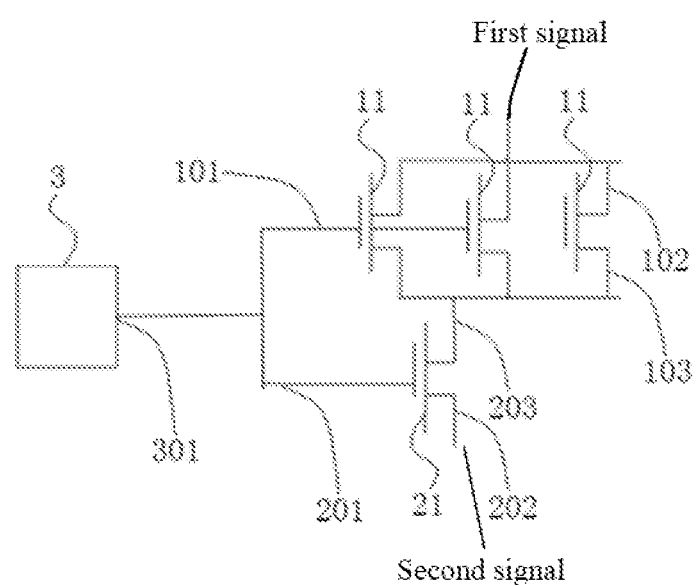
FIG. 2 is a schematic structural diagram of a circuit of a driving unit according to one embodiment of the present invention.
Figure 3A:
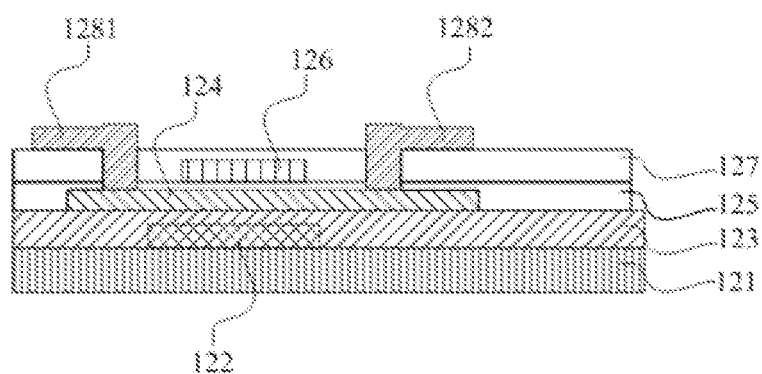
FIG. 3a is a schematic structural view of a transistor of a driving unit according to one embodiment of the present invention.
Figure 3B:
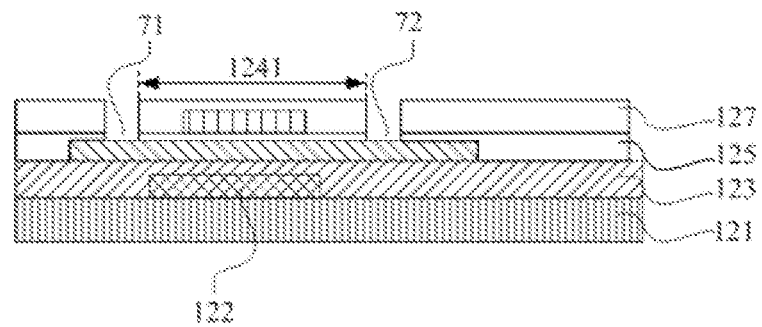
FIG. 3b is a schematic structural view of a transistor with a source and a drain removed according to one embodiment of the present invention.

Optionally, as shown in FIGS. 2 and 3, the first switching element 11 and the second switching element 21 each include a transistor such as a thin film transistor. As shown in FIGS. 3a and 3b, the structure of the transistor may be the structure Shown in FIG. 3a. The transistor may include a base substrate 121, a light-blocking layer 122 disposed above the substrate 121, a buffer layer 123 disposed above the light-blocking layer 122, an active region 124 above the buffer layer 123, a gate insulating layer 125 disposed over the active region 124, a gate electrode 126 disposed over the gate insulating layer 125, and a source 1281 and a drain 1282 disposed on both sides of the gate electrode 125 respectively. The source 1281 and the drain 1282 are in contact with the active region 124 via a first via hole 71 and a second via hole 72 respectively. The source 1281 and the drain 1282 are formed over an electrode insulating layer 127, and the gate 126 is formed under the electrode insulating layer 127.

Transistors are commonly used switching elements, which are low in cost and suitable for narrow bezel display apparatus. It is understandable that the thin film transistors in the embodiments of the present disclosure are not limited to the top-gate type thin film transistors having the structure shown in FIGS. 3a and 3b, and other types such as bottom-gate type thin film transistors are also possible.

Optionally, the first driving sub-circuit 1 further includes a diode, one electrode of the diode is connected to the first signal generating terminal, and the other electrode of the diode is connected to the first output terminal.

Optionally, the second driving sub-circuit 2 further includes a diode, one electrode of which is connected to the second signal generating terminal, and the other electrode thereof is connected to the second output terminal.

In the above embodiments, an electrode of the diode is connected to the first signal generating terminal. Basically, one electrode of the diode is used for inputting the first signal. Therefore, one electrode of the diode can also be connected to the first signal input terminal 102 of any of the first switching elements 11. Similarly, one electrode of the diode is connected to the second signal generating terminal. Basically, one electrode of the diode is used for inputting the second signal. Therefore, one electrode of the diode can also be connected to the second signal input terminal 202 of any of the second switching elements 21.

The presence of the diode can control the timing of the output signal of the driving sub-circuit, such as appropriate delay. Of course, when the gate of the thin film transistor is connected to one of the source and the drain of the thin film transistor, and the other of the source and the drain is connected to the output terminal of the driving sub-circuit, the thin film transistor is equivalent to a diode. Thus, the above diode can be realized by this equivalent method. In addition, the diode can provide protection to the transistor to a certain degree, for example, electrostatic protection.

Optionally, the first driving sub-circuit 1 and/or the second driving sub-circuit further include a capacitor, a resistor and etc. Preferably, the first switching element 11 is one of a P-type thin film transistor or an N-type thin film transistor, and the second switching element 21 is the other.

The combination of the P-type thin film transistor and the N-type thin film transistor can well satisfy the requirement that one of the two switching elements is always turned on while the other is turned off.

Figure 4:
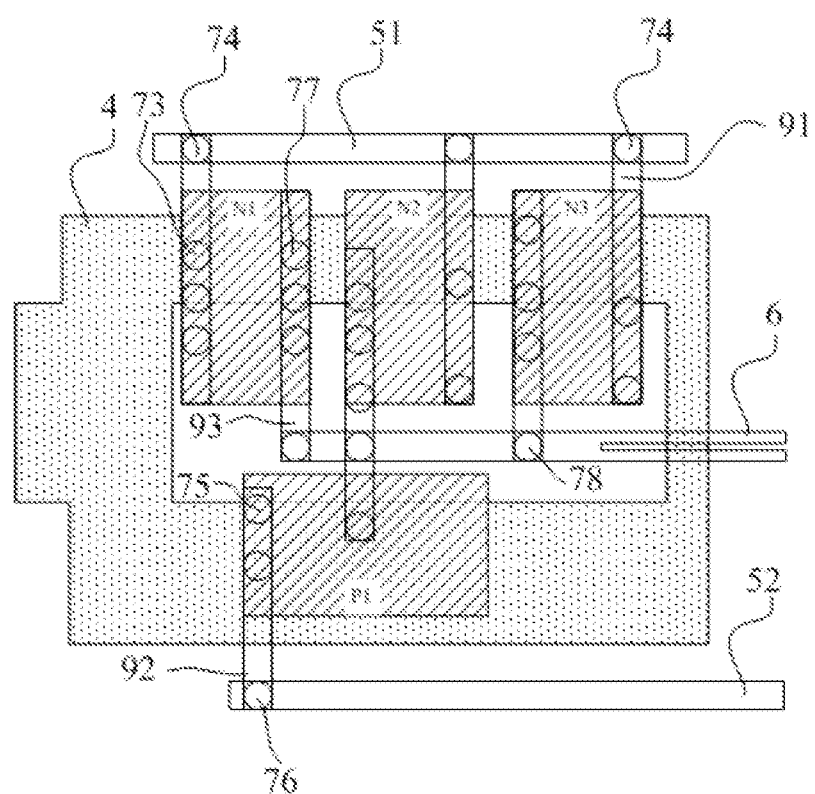
FIG. 4 is a schematic structural view of a circuit of a driving unit according to one embodiment of the present invention.

In one embodiment, as shown in FIG. 4, in a driving unit, the first driving sub-circuit 1 includes at least three N-type thin film transistors (only three are shown), that is, a first N-type thin film transistor N1, a second N-type thin film transistor N2, and a third N-type thin film transistor N3. The sources of the three N-type thin film transistors are connected to the first signal generating terminal through the first signal input line 51. The drains of the three N-type thin film transistors are connected to the gate line 8 through the driving signal output line 6. The second driving sub-circuit 2 includes a first P-type thin film transistor P1 whose source is connected to the second signal generating terminal through the second signal input line 52, and the drain thereof is connected to the gate line 8 through the driving signal output line 6.

Figure 5:
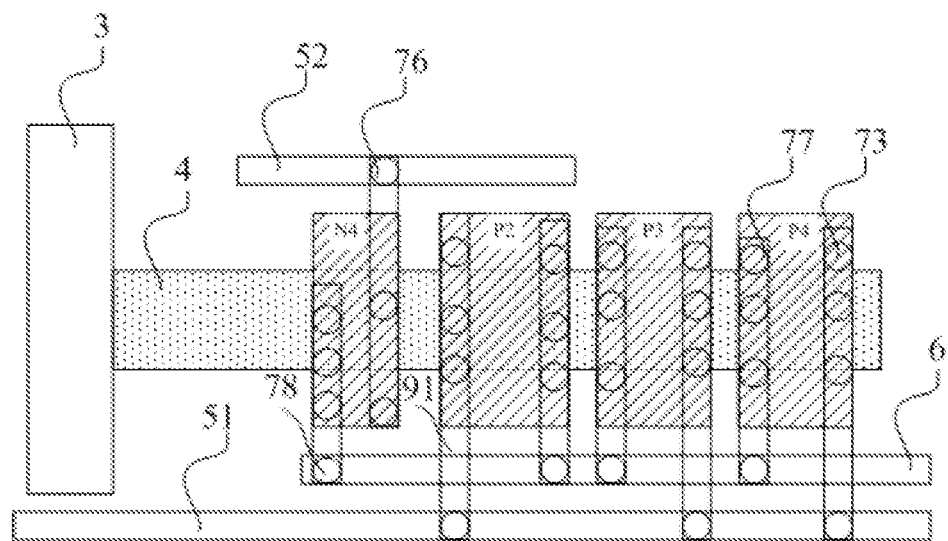
FIG. 5 is a schematic structural view of a circuit of a driving unit according to one embodiment of the present invention.

In one embodiment, as shown in FIG. 5, in a driving unit, the first driving sub-circuit 1 includes three P-type thin film transistors, that is, a second P-type thin film transistor P2, a third P-type thin film transistor P3, and a fourth P-type thin film transistor P4. The sources of the P-type thin film transistors are connected to the first signal generating terminal through the first signal input line 51, and the drains of the P-type thin film transistors are connected to the gate line 8 through the driving signal output line 6. The second driving sub-circuit 2 includes a fourth N-type thin film transistor N4 whose source is connected to the second signal generating terminal through the second signal input line 52, and the drain thereof is connected to the gate line 8 through the driving signal output line 6.

Figure 6:
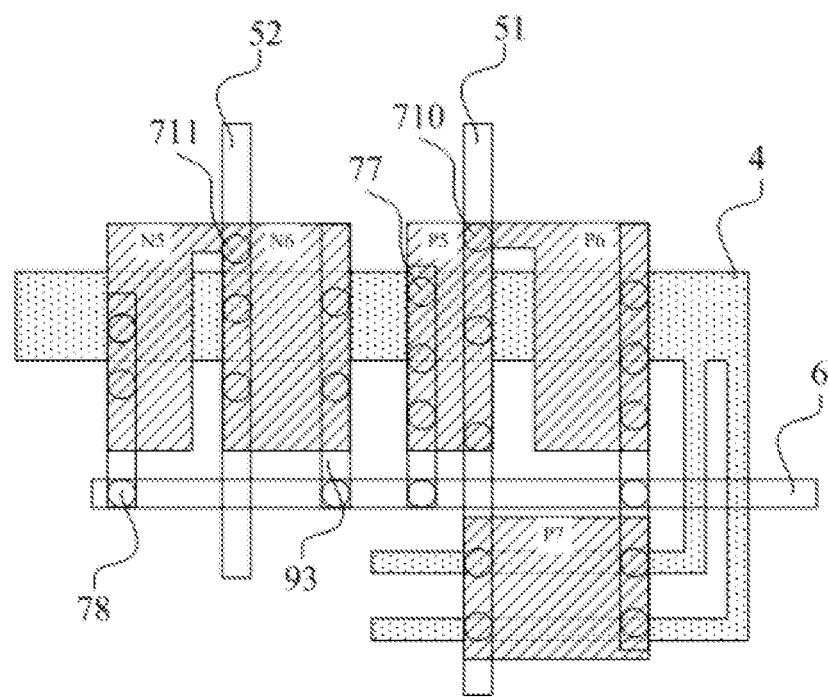
FIG. 6 is a schematic structural of a circuit of a driving unit according to one embodiment of the present invention.

In one embodiment, as shown in FIG. 6, in a driving unit, the first driving sub-circuit 1 includes three P-type thin film transistors, that is, a fifth P-type thin film transistor P5, a sixth P-type thin film transistor P6, and a seventh P-type thin film transistor P7. The sources of the three P-type thin film transistors are connected to the first signal generating terminal through the first signal input line 51, and the drains of the three P-type thin film transistors are connected to the gate line 8 through the driving signal output line 6. The second driving sub-circuit 2 includes two N-type thin film transistors, that is, a fifth N-type thin film transistor N5 and a sixth N-type thin film transistor N6. The sources of the two N-type thin film transistors are connected to the second signal generating terminal through the second signal input line 52, and the drains of the two N-type thin film transistors are connected to the gate line 8 through the driving signal output line 6.

Figure 7:
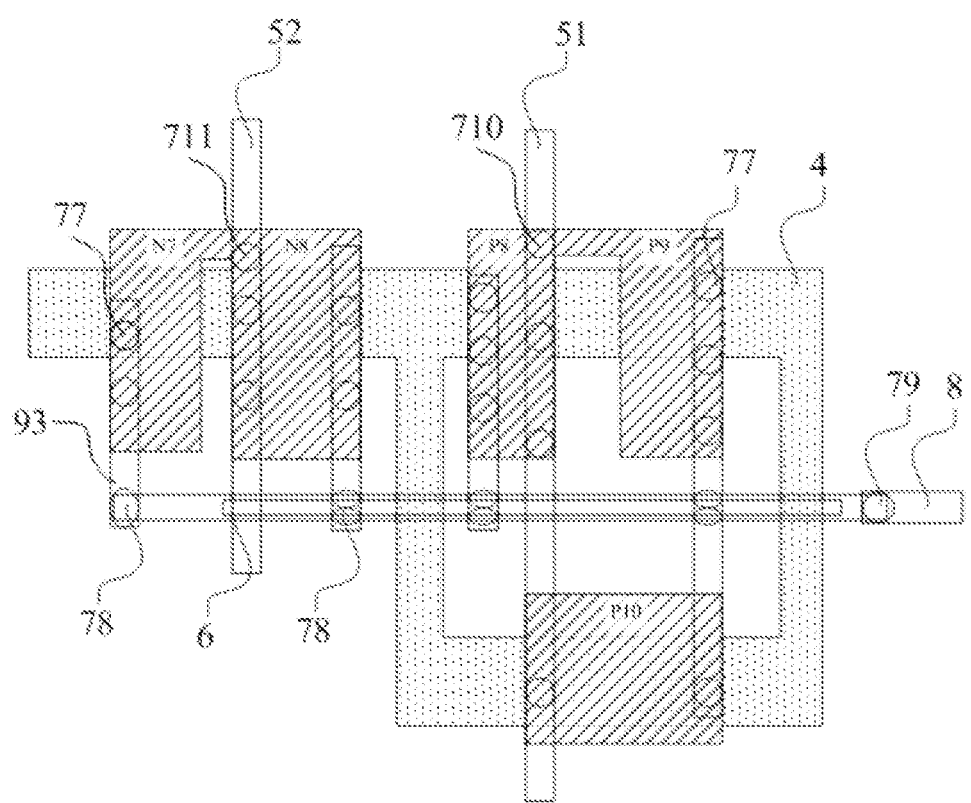
FIG. 7 is a schematic structural view of a circuit of a driving unit according to one embodiment of the present invention.

In one embodiment, as shown in FIG. 7, in a driving unit, the first driving sub-circuit 1 includes three P-type thin film transistors, that is, an eighth P-type thin film transistor P8, a ninth P-type thin film transistor P9, and a tenth P-type thin film transistor P10. The sources of the three P-type thin film transistors are connected to the first signal generating terminal through the first signal input line 51, and the drains of the three P-type thin film transistors are connected to the gate line 8 through the driving signal output line 6. The second driving sub-circuit 2 includes two N-type thin film transistors, that is, a seventh N-type thin film transistor N7 and an eighth N-type thin film transistor N8. The sources of the two N-type thin film transistors are connected to the second signal generating terminal through the second signal input line 52, and the drains of the two N-type thin film transistors are connected to the gate line 8 through the driving signal output line 6.

Optionally, as shown in FIGS. 3a to 7, each of the switching elements of FIGS. 4 to 7 includes the structure of FIGS. 3a and 3b.

Referring to FIGS. 4 and 5, the first signal input line 51 may not be directly connected to one of the source 1281 and the drain 1282 of each of the first switching elements 11, but may be connected through a plurality of first transmission lines 91. That is, one of the source 1281 and the drain 1282 of each of the first switching elements 11 corresponds to a first transmission line 91. When the leads or conductive layers of the two to be connected are not in the same layer, a corresponding via hole needs to be provided.

In one embodiment, one of the source 1281 or the drain 1282 of each first switching element 11 is connected to a first transmission line 91 through a third via hole 73. The first transmission line 91 and the first signal input line 51 are connected by a fourth via hole 74.

The second signal input line 52 may not be directly connected to one of the source 1281 or the drain 1282 of each second switching element 21, but may be connected through a plurality of second transmission lines 92. That is, one of the source 1281 or the drain 1282 of each second switching element 21 corresponds to a second transmission line 92, and for the same reason as described above, a corresponding via hole is required.

In one embodiment, one of the source 1281 or the drain 1282 of each second switching element 21 is connected to a second transmission line 92 through the fifth via hole 75. The second transmission line 92 and the second signal input line 52 are connected through a sixth via hole 76.

In one embodiment, as shown in FIGS. 4 to 7, the other one of the source 1281 or the drain 1282 of each first switching element 11 is not directly connected to the driving signal output line 6. The other one of the source 1281 or the drain 1282 of each second switching element 21 is not directly connected to the driving signal output line 6. Instead, the other one of the source 1281 or the drain 1282 of each first switching element 11 and the other one of the source 1281 or the drain 1282 of each second switching element 21 are connected through a plurality of third transmission lines 93. That is, the other one of the source 1281 and the drain 1282 of each first switching element 11 corresponds to a third transmission line 93, and the other one of the source 1281 and the drain 1282 of each second switching element 21 also corresponds to a third transmission line 93. For the same reason as described above, it is necessary to provide corresponding via holes.

In one embodiment, the drain 1282 of the first switching element 11 and the drain 1282 of the second switching element 21 are respectively connected to the third transmission line 93 through a seventh via hole 77. The third transmission line 93 and the driving signal output line 6 are connected through an eighth via hole 78.

In one embodiment, the driving signal output line 6 is connected to the gate line 8 through a ninth via hole 79.

In one embodiment, as shown in FIGS. 6 and 7, unlike the structures in FIGS. 4 and 5, the first signal input line 51 and one of the source 1281 and the drain 1282 of each of the first switching elements 11 are directly connected through the tenth via hole 710. The second signal input line 52 and one of the source 1281 and the drain 1282 of each of the second switching elements 21 are directly connected through the eleventh via hole 711.

Optionally, at least two via holes out of the third via hole 73, the fourth via hole 74, the fifth via hole 75, the sixth via hole 76, the seventh via hole 77, the eighth via hole 78, the ninth via hole 79, and the tenth via hole 710 and the eleventh via hole 711 are formed by a same patterning process or have the same depth. In one embodiment, the first signal input line 51 and the second signal input line 52 are in the same layer as the gate 126, the driving signal output line 6 is disposed in the same layer as the drain 1282, and the gate line 8 is disposed in the same layer as the gate 126.

Optionally, the driving signal output line 6 may be disposed in the same layer as one of the source 1281 and the drain 1282; or may be disposed in the same layer as the gate 126; or may be disposed in the same layer as other conductive layers.

Optionally, the driving signal output line 6 and the gate line 8 may also be connected by other conductive layers. For example, the driving signal output line 6 and the gate line 8 and the gate electrode 126 are in the same layer, and are connected by a transparent conductive layer. The transparent conductive layer may be a layer of ITO, IZO, etc. Specifically, the transparent conductive layer may be made of the same material as the common electrode or the pixel electrode of the display apparatus.

Optionally, the active region of the thin film transistor is above the control signal input line 4, and the first signal input line 51 and the second signal input line 52 are above the active region of the thin film transistor. However, the thin film transistor is not limited to the structures in FIGS. 3a to 7.

Optionally, the active region of the thin film transistor may be made of a semiconductor material such as silicon (such as amorphous silicon, low temperature polysilicon) or metal oxide.

Optionally, as shown in FIG. 4, the number of N-type thin film transistors has to be at least two more than the number of the P-type thin film transistors. Therefore, it is possible to ensure that the first driving sub-circuit 1 has sufficient time to output the first signal, for example, when the gate line 8 needs to maintain the first signal for a long time.

Optionally, as shown in FIG. 5, the first switching element 11 is P-type thin film transistor, and the second switching element 21 is N-type thin film transistor. The number of P-type thin film transistors is at least two more than the number of N-type thin film transistors.

In one embodiment, the electron mobility of the P-type thin film transistor is lower than the electron mobility of the N-type thin film transistor, and the first signal output by the first driving sub-circuit 1 can meet charging requirement such as achieving a predetermined voltage value as soon as possible by increasing the number of P-type thin film transistors.

Optionally, the source and the drain of the P-type thin film transistor are disposed in the same layer, and at least one conductive block is disposed between the source and the drain thereof. The conductive block is disposed in the same layer as the source and the drain thereof and the conductive block, the source and the drain are spaced apart from one another.

Optionally, the source and the drain of the N-type thin film transistor are disposed in the same layer, and at least one conductive block is disposed between the source and the drain. The conductive block is disposed in the same layer as the source and the drain, and the conductive block, the source and the drain are spaced apart from one another.

The conductive block can reduce the conduction spacing between the source and the drain and increase the electron mobility. That is, although the source and the drain are still spaced apart, there is at least one conductive block between the two, which is beneficial to the source and drain conduction by electromagnetic induction. In addition, the conductive reinforcing layer may be fabricated using a metal of a source or a drain of a thin film transistor or other conductive layer.

In one embodiment, when the process conditions are different or the purpose is different, the electron mobility of the P-type thin film transistor and the N-type thin film transistor is different. When the corresponding functional layers of the P-type thin film transistor and the N-type thin film transistor have the same or little difference in size, the electron mobility of the P-type thin film transistor is generally smaller than that of the N-type thin film transistor. In order to make the electron mobility of the two thin films uniform, the N-type thin film transistor and the P-type thin film transistor may include one of the following various structures or combinations thereof.

In one embodiment, as shown in FIGS. 3a and 3b, the active region of the thin film transistor includes a source region in contact with the source 1281, a drain region in contact with the drain 1282, and a semiconductor region 1241 between the source region and the drain region 1282. The semiconductor region 1241 is a channel region when the thin film transistor is turned on. The size of the semiconductor region 1241 in the direction from the source 1281 to the drain 1282 is the length of the active region, and the size of the semiconductor region 1241 in the direction perpendicular to the direction from the source 1281 to the drain 1282 is the width of the active region.

Optionally, the width to length ratio of the active region of the N-type thin film transistor is 12 to 4 times to the width to length ratio of the active region of the P-type thin film transistor.

Optionally, the length of the active region of the N-type thin film transistor is greater than the length of the active region of the P-type thin film transistor.

Optionally, the width of the active region of the N-type thin film transistor is greater than the width of the active region of the P-type thin film transistor.

Optionally, the overlapping area of the gate and the active region of the N-type thin film transistor is larger than that of the P-type thin film transistor.

The P-type thin film transistor and the N-type thin film transistor of the above optional structure are used as the switching elements of the driving unit, so that the electron mobility of each switching element of the driving unit is substantially the same. Accordingly, the driving unit can accurately control the output timing of the driving signals. As such, the turning-on timing and the turning-off timing of the gate lines 8 can be precisely controlled.

In one embodiment, in order to reduce mutual influence between the switching elements, the active regions of at least some of the first switching elements 11 of the first driving sub-circuit 1 are spaced apart from one another, and/or the active regions of at least some of the second switching elements 21 of the second driving sub-circuit 2 are spaced apart from one another.

According to different wiring manners, optionally, the active regions of some first switching elements 11 are spaced apart from one another, and the active regions of some second switching elements 21 are spaced apart from one another. As such, the switching elements sharing one active region can also share the first signal input line 51 and/or the second signal output line 52, thereby saving the wiring structure and wiring process of the first signal input line 51 and/or the second signal output line 52, as shown in FIGS. 6 and 7.

Optionally, the active regions of all the switching elements are spaced apart from one another. Such a structure can better realize operation of the respective switching elements at intervals without affecting one another, as shown in FIGS. 4 and 5.

Optionally, as shown in FIGS. 4 to 7, in order to facilitate wiring, the control signal output terminal 301 is selectively connected to all of the first switching elements 11 and the second switching elements 21 via a control signal input line 4.

Optionally, the first signal input terminals 102 of all the first switching elements 11 and the first signal generating terminal are connected by a first signal input line 51. With the above-mentioned circuit structure, it is relatively convenient to realize that all the first switching elements 11 simultaneously receive the first signal, thereby reducing timing difference at which the first signal input terminals 102 of the plurality of first switching elements 11 receive the first signal.

Optionally, the second signal input terminals 202 of all the second switching elements 21 and the second signal generating terminal are connected by a second signal input line 52. With the above-mentioned circuit structure, it is relatively convenient to realize that all the second switching elements 21 simultaneously receive the second signal, thereby reducing timing difference at which the second signal input terminals 202 of the plurality of second switching elements 21 receive the second signal.

Optionally, the first signal output terminals 103 of all the first switching elements 11 and the second signal output terminals 203 of all the second switches 21 are connected to a driving signal output line 6.

That is to say, the output of each switching element is connected to the output of the entire driving unit through a line. As such, on the one hand, wiring is simplified. On the other hand, transmission parameter of the signal outputted by each output terminal is ensured to be consistent.

Optionally, as shown in FIGS. 4, 6, and 7, the overlapping area of the driving signal output line 6 and the control signal input line 4 is larger than the overlapping area of the driving signal output line 6 and the first signal input line 51. Optionally, the overlapping area of the driving signal output line 6 and the control signal input line 4 is larger than the overlapping area of the driving signal output line 6 and the second signal input line 52. The above embodiments reduce interference of the first signal input line 51 and the second signal input line 52 on the drive signal output line 6.

In addition, an overlap capacitance may be generated at the intersection of the driving signal output line 6 and the control signal input line 4. Therefore, the overlapping area of the driving signal output line 6 and the control signal input line 4 may be small.

Optionally, in order to reduce the overlapping area of the driving signal output line 6 and the control signal input line 4, the following manners may be adopted:

In the first manner, referring to FIG. 4, the driving signal output line 6 has bifurcated structure at the overlapping area with the control signal input line 4.

In the second manner, referring to FIG. 6, the control signal input line 4 has a bifurcated structure at the overlapping area with the driving signal output line 6.

In the third manner, referring to FIG. 7, the driving signal output line 6 has a hollow structure at the overlapping area with the control signal input line 4.

Optionally, the width of the first signal input line 51 is D1, the width of the second signal input line 52 is D2, and the width of the driving signal output line 6 is D3, wherein D1 is greater than 2*D2, and D2 is greater than 2*D3. For example, the lead wires (the first signal input line 51, the second signal input line 52, and the driving signal output line 6) have an extending direction as a whole, and the current propagates in the extending direction of the lead wires. The direction perpendicular to the overall current is the width direction of the lead wires.

That is to say, the width of the lead wire can be determined according to the voltage of the signal to be transported, and the width of the lead wire for transporting the high voltage is wider than the width of the lead wire for transporting the low voltage, thereby ensuring stability of the transmitted signal. Furthermore, the lead wire is not easily damaged.

Optionally, the first signal input line 51 and the driving signal output line 6 are located at different layers and perpendicular to each other. Optionally, the second signal input line 52 and the driving signal, output line 6 are located at different layers and perpendicular to each other.

Optionally, the first signal input line 51 and the second signal input line 52 are located at the source and drain layer of the thin film transistor, and the driving signal output line 6 is located at the gate layer of the thin film transistor. The above wiring manner facilitates the preparation of the first signal input line 51, the second signal input line 52, and the driving signal output line 6.

Optionally, as shown in FIGS. 4 to 7, at least two of the first signal input line 51, the second signal input line 52, the control signal input line 4, and the driving signal output line 6 are parallel to each other. In one embodiment, as shown in FIG. 4, the first signal input line 51, the driving signal output line 6, and the second signal input line 52 are three parallel lines. In one embodiment, as shown in FIG. 5, the first signal input line 51, the second signal input line 52, and the control signal input line 4 and the driving signal output line 6 are parallel to one another. In one embodiment, as shown in FIGS. 6 and 7, the first signal input line 51 and the second signal input line 52 are parallel to each other.

Optionally, as shown in FIGS. 4 to 7, any two of the first signal input line 51, the second signal input line 52, the control signal input line 4, and the driving signal output line 6 overlap. Therefore, the above wiring structure can prevent overlapping portions of the two lead wires from generating overlapping capacitance, thereby facilitating wiring.

Optionally, in order to facilitate wiring, the control signal line 4 is arranged as a ring structure, as shown in FIG. 4.

Optionally, the first switching elements 11 of the first driving sub-circuit 1 are distributed on both sides of the driving signal output line 6, as shown in FIGS. 4, 6, and 7.

Optionally, the second switching elements 21 of the second driving sub-circuit 2 are distributed on both sides of the driving signal output line 6.

Optionally, each of the first switching elements 11 and each of the second switching elements 21 are located between the first signal input line 51 and the second signal input line 52, as shown in FIGS. 4 and 5.

According to different situations, the first switching elements 11, the second switching elements 21, the first signal input line 51, the second sural input line 52 and the driving signal output line 6 can adopt different relative positional relationships, thereby facilitating wiring and reducing overlap area between functional layers to reduce overlapping capacitances.

Figure 8:
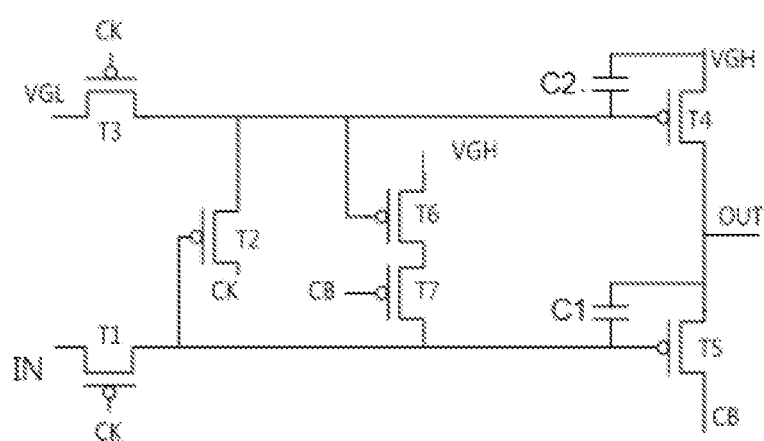
FIG. 8 is a schematic structural diagram of a driving control circuit in a driving unit of a gate driving circuit according to one embodiment of the present invention.
Figure 9:
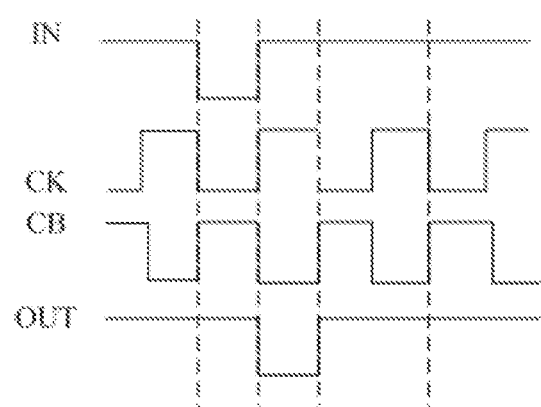
FIG. 9 is a driving timing chart of a driving control circuit according to one embodiment of the present disclosure.

Another example of the present disclosure is a gate driving circuit. As shown in FIGS. 8 to 9, the example provides a gate driving circuit, including a plurality of driving units according to embodiments of the present disclosure. The first output terminal and the second output terminal of at least one of the driving units are connected to at least one gate line.

Optionally, a plurality of the above driving units may be combined to form a complete gate driving circuit, and each of the driving units corresponds to one gate line. Alternatively, the first driving sub-circuit is connected to a gate line, and the second driving sub-circuit is connected to another gate line.

That the first output terminal of the driving unit is connected to the gate line means that the first signal output terminals of the first switching elements are connected to the gate line. Similarly, that the second output terminal of the driving unit is connected to the gate line means that the second signal output terminals of the second switching elements are connected to the gate line.

Optionally, the driving control circuit 3 in each driving unit of the gate driving circuit is a shift register. The first signal input terminals of all the driving units are connected to a first signal generating terminal, and the second signal input terminals of all the driving units are connected to a second signal generating terminal.

That is, one or some of the drive units (shift registers) of the existing gate drive circuit (GOA) can be used as the driving control circuit. Alternatively, the first driving sub-circuit and the second driving sub-circuit may be added to the driving unit for each output driving signal of the existing gate driving circuit to constitute the driving unit of the present embodiment.

Optionally, as shown in FIG. 8, the driving control circuit (for example, the shift register) in each driving unit of the embodiment includes seven P-type transistors (the P-type transistor is turned off at a high level and turned on at a low level), that is, the first transistor T1, the second transistor T2, the third transistor 13, the fourth transistor 14, the fifth transistor 15, the sixth transistor T6, and the seventh transistor T7; and two storage capacitors, and the output terminal OUT and the input terminal IN. Of course, the output terminal OUT of the first-stage driving control circuit is connected to a separate control terminal, the first voltage terminal VGL is for receiving a low level, and the second voltage terminal VGH is for receiving a high level.

The driving timing of the driving control circuit 3 is as shown in FIG. 9. In FIG. 9, the first clock terminal is CK, and the second clock terminal CB outputs a control signal generated by the driving control circuit 3.

Alternatively, a plurality of cascaded shift registers in the gate driving circuit may be replaced with a driving chip (IC) or other driving circuits.

Optionally, the driving control circuit 3 in each driving unit of the gate driving circuit is a shift register, and the plurality of shift registers are cascaded with one another. For example, the output terminal OUT of at least one of the driving control circuits is connected to the input terminal IN of the driving control circuit of the next stage.

Optionally, the driving control circuit 3 in each driving unit of the gate driving circuit is a shift register, wherein at least one of the first output terminal and the second output terminal of each driving unit is connected to the input terminal IN of the driving control circuit of the next stage.

Another example of the present disclosure provides an array substrate, including the driving unit of any of the above embodiments or a combination thereof. The array substrate is capable of flexibly controlling the tarn-on timing and turn-off timing of the gate lines, thereby improving the display quality of the display apparatus including the array substrate.

Another embodiment of the present disclosure provides a display apparatus comprising the driving unit of any of the above embodiments or a combination thereof.

The display apparatus is capable of flexibly controlling the turn-on and turn-off timings of the gate lines, thereby improving the display quality of the display apparatus.

Of course, the display apparatus may be an OLED (Organic Light Emitting Diode) display apparatus, a liquid crystal display apparatus, or the like. The display apparatus can also be any other type of display apparatus.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A driving unit, comprising:
a first driving sub-circuit,
a second driving sub-circuit, and
a driving control circuit;
wherein the driving control circuit includes a first transistor, a second transistor, a third transistor, a fourth transistor, a fifth transistor; a sixth transistor, and a seventh transistor;
a first terminal of the first transistor is coupled to an input terminal, a second terminal of the first transistor is coupled to a first clock terminal and a third terminal of the first transistor is coupled to a second terminal of the fifth transistor;
a first terminal of the second transistor is coupled to the first clock terminal, a second terminal of the second transistor is coupled to the third terminal of the first transistor, and a third terminal of the second transistor is coupled to a third terminal of the third transistor;
a first terminal of the third transistor is coupled to a first voltage terminal, a second terminal of the third transistor is coupled to the first clock terminal, and the third terminal of the third transistor is coupled to a second terminal of the fourth transistor;
a first terminal of the fourth transistor is coupled to a second voltage terminal and a third terminal of the fourth transistor is coupled to an output terminal of the driving control circuit;
a first terminal of the fifth transistor is coupled to an output terminal of the driving control circuit and a third terminal of the fifth transistor is coupled to a second clock terminal;
a first terminal of the sixth transistor is coupled to the second voltage terminal, a second terminal of the sixth transistor is coupled to the third terminal of the third transistor, a third terminal of the sixth transistor is coupled to a third terminal of the seventh transistor;
a first terminal of the seventh transistor is coupled to the third terminal of the first transistor and a second terminal of the seventh transistor is coupled to the second clock terminal;
wherein the first driving sub-circuit comprises a plurality of first switching elements, the second driving sub-circuit comprises a plurality of second switching elements, the first switching elements and the second switching elements are transistors, at least one of the first switching elements is a P-type thin film transistor, and at least one of the second switching elements is an N-type thin film transistor;
a first signal output terminal of the at least one of the first switching elements and a second signal output terminal of the at least one of the second switching elements are coupled to an output terminal of the driving unit;
an active region of the P-type thin film transistor and the N-type thin film transistor includes a source region and a drain region, and a semiconductor region between the source region and the drain region; and wherein a width to length ratio of the active region of the P-type thin film transistor is 1.2 to 4 times a width to length ratio of the active region of the N-type thin film transistor;

and/or,
a length of the active region of the N-type thin film transistor is greater than a length of the active region of the P-type thin film transistor;

and/or,
a width of the active region of the N-type thin film transistor is smaller than a width of the active region of the P-type thin film transistor;

and/or,
an overlapping area of a gate and the active region of the P-type thin film transistor is larger than an overlapping area of a gate and the active region of the N-type thin film transistor.

2. The driving unit of claim 1, wherein a first control signal input terminal of each of the first switching elements of the first driving sub-circuit is coupled to the output terminal of the driving control circuit, a first signal input terminal of each of the first switching elements is coupled to a first signal generating terminal, and a second signal input terminal of each of the second switching elements is coupled to a second signal generating terminal.

3. The driving unit of claim 2, wherein the number of the first switching elements is more than the number of the second switching elements.

4. The driving unit of claim 1, wherein the output terminal of the driving control circuit is configured to transmit a control signal, the control signal includes a first control signal and a second control signal, the first control signal, is configured to turn on the first switching elements and turn off the second switching elements, and the second control signal is configured to turn on the second switching elements and turn off the first switching elements.

5. The driving unit of claim 2, wherein the first switching elements includes at least three P-type thin film transistors and the second switching elements includes at least two N-type thin film transistors.

6. The driving unit of claim 5, wherein active regions of the P-type thin film transistors and the active regions of the N-type thin film transistors are made of low temperature polysilicon or metal oxide.

7. The driving unit of claim 6, wherein the active regions of the P-type thin film transistors are made it low temperature polysilicon.

8. The driving unit of claim 6, wherein the active regions of the N-type thin film transistors are made of metal oxide.

9. The driving unit of claim 1, wherein the driving control circuit includes a first capacitor and a second capacitor, a first terminal of the first capacitor is coupled to the second terminal of the fifth transistor, a second terminal of the first capacitor is coupled to the output terminal of the driving control circuit, a first terminal of the second capacitor is coupled to the second terminal of the fourth transistor, and a second terminal of the second capacitor is coupled to the output terminal of the driving control circuit.

10. The driving unit of claim 1, wherein a conductive block is disposed between the source and the drain, the conductive block and a source and a drain of the P-type thin film transistor are in a same layer, the conductive block, the source, and the drain are spaced apart from one another.

11. The driving unit of claim 1, wherein active regions of the first switching elements are spaced apart from one another, and/or active regions of the second switching elements are spaced apart from one another.

12. The driving unit of claim 2, wherein first control signal input terminals of the first switching elements are coupled to the output terminal of the driving control circuit through a control signal input line; and/or first signal input terminals of the first switching elements are coupled to the first signal generating terminal through a first signal input line;

and/or,
second signal input terminals of the second switching elements are coupled to the second signal generating terminal through a second signal input line; and/or first signal output terminals of the first switching elements and second signal output terminals of the second switching elements are coupled to a driving signal output hue.

13. The driving unit of claim 12, wherein the driving signal output line and the control signal input line are in different layers and overlap each other;

the driving signal output line and at least one of the first signal input line and the second signal input line are in different layers and overlap each other;

an overlapping area of the driving signal output line and the control signal input line is greater than an overlapping area of the driving signal output line and the first signal input line; and/or, an overlapping area of the driving signal output line and the control signal input line is greater than an overlapping area of the driving signal output line and the second signal input line.

14. The driving unit of claim 12, wherein the first signal input line and the driving signal output line are at different layers and perpendicular to each other; and/or, the second signal input line and the driving signal output line are at different layers and perpendicular to each other.

15. The driving unit of claim 12, wherein at least two of the first signal input line, the second signal input line, the control signal input line, and the driving signal output line are parallel to each other or one another.

16. The driving unit of claim 12, Wherein the first control signal input line is of a ring structure; and/or, the first switching elements of the first driving sub-circuit are distributed on both sides of the driving signal output line; and/or the second switching elements of the second driving sub-circuit are distributed on oil sides of the driving signal output line;

and/or,
the first switching elements and the second switching elements are located between the first signal input line and the second signal input line.

17. The driving unit of claim 1, wherein the second driving sub-circuit comprises at least two second switching elements, and the driving control circuit is a shift register.

18. An array substrate, comprising:
a plurality of driving units comprising the driving unit according to claim 1, wherein the output terminal of the driving unit is coupled to at least one gate line.

19. An OLED display apparatus, comprising a driving unit:

the driving unit comprising: a first driving sub-circuit, a second driving sub-circuit, and a driving control circuit;

wherein the driving control circuit includes a first transistor, a second transistor, a third transistor, a fourth transistor, a fifth transistor, a sixth transistor, and a seventh transistor;

a first terminal of the first transistor is coupled to an input terminal, a second terminal of the first transistor is coupled to a first clock terminal and a third terminal of the first transistor is coupled to a second terminal of the fifth transistor;

a first terminal of the second transistor is coupled to the first clock terminal a second terminal of the second transistor is coupled to the third terminal of the first transistor, and a third terminal of the second transistor is coupled to a third terminal of the third transistor;

a first terminal of the third transistor is coupled to a first voltage terminal, a second terminal of the third transistor is coupled to the first clock terminal, and the third terminal of the third transistor is coupled to a second terminal of the fourth transistor;

a first terminal of the fourth transistor is coupled to a second voltage terminal and a third terminal of the fourth transistor is coupled to an output terminal of the driving control circuit;

a first terminal of the fifth transistor is coupled to an output terminal of the driving control circuit and a thud terminal of the fifth transistor is coupled to a second clock terminal;

a first terminal of the sixth transistor is coupled to the second voltage terminal, a second terminal of the sixth transistor is coupled to the third terminal of the third transistor, a third terminal of the sixth transistor is coupled to a third terminal of the seventh transistor;

a first terminal of the seventh transistor is coupled to the third terminal of the first transistor and a second terminal of the seventh transistor is coupled to the second clock terminal;

wherein the first driving sub-circuit comprises a plurality of first switching elements, the second driving sub-circuit comprises a plurality of second switching elements, at least one of the first switching elements is a P-type thin film transistor, at least one of the second switching elements is an N-type thin film transistor;

a first signal output terminal of the at least one of the first switching elements and a second signal output terminal of the at least one of the second switching elements are coupled to an output terminal of the driving unit;

an active region of the P-type thin film transistor and the N-type thin film transistor includes a source region and a chain region, and a semiconductor region between the source region and the drain region; and wherein a width to length ratio of the active region of the P-type thin film transistor is 1.2 to 4 times a width to length ratio of the active region of the N-type thin film transistor;

and/or, a length of the active region of the N-type thin film transistor is greater than a length of the active region of the P-type thin film transistor, and/or, a width of the active region of the N-type thin film transistor is smaller than a width of the active region of the P-type thin film transistor;

and/or, an overlapping area of a gate and the active region of the P-type thin film transistor is larger than an overlapping; area of a gate and the active region of the N-type thin film transistor.

* * * * *